US012703602B2

(12) United States Patent
Shiramizu et al.

(10) Patent No.: US 12,703,602 B2
(45) Date of Patent: Aug. 11, 2026

(54) SEMICONDUCTOR MODULE AND LIFE PREDICTION SYSTEM FOR SEMICONDUCTOR MODULE

(71) Applicant: Mitsubishi Electric Corporation, Tokyo (JP)

(72) Inventors: Masataka Shiramizu, Tokyo (JP); Kazuhiro Kawahara, Tokyo (JP); Hirohito Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2043 days.

(21) Appl. No.: 16/668,883

(22) Filed: Oct. 30, 2019

(65) Prior Publication Data

US 2020/0247642 A1 Aug. 6, 2020

(30) Foreign Application Priority Data

Feb. 5, 2019 (JP) ................................ 2019-018479

(51) Int. Cl.
*B66B 1/30* (2006.01)
*B66B 1/34* (2006.01)
(Continued)

(52) U.S. Cl.
CPC .................. *B66B 1/30* (2013.01); *B66B 1/34* (2013.01); *B66B 5/00* (2013.01); *G01R 31/2642* (2013.01)

(58) Field of Classification Search
CPC ........... B66B 5/00; B66B 5/0087; B66B 1/30; B66B 1/34; G01R 31/2642
See application file for complete search history.

(56) References Cited

U.S. PATENT DOCUMENTS

2003/0076232 A1* 4/2003 Sato ........................ H02M 7/00 340/584
2005/0071090 A1 3/2005 Katou
(Continued)

FOREIGN PATENT DOCUMENTS

CN 1618164 A 5/2005
CN 102190218 A 9/2011
(Continued)

OTHER PUBLICATIONS

An Office Action; "Notice of Reasons for Refusal", mailed by the Japanese Patent Office on Feb. 1, 2022, which corresponds to Japanese Patent Application No. 2019-018479 and is related to U.S. Appl. No. 16/668,883; with English language translation.
(Continued)

*Primary Examiner* — Eman A Alkafawi
*Assistant Examiner* — Suresh K Rajaputra
(74) *Attorney, Agent, or Firm* — Studebaker Brackett PLLC

(57) ABSTRACT

An object of the invention is to provide the semiconductor module which can predict a life precisely, and the life prediction system for the semiconductor module. The semiconductor module according to the present invention includes IGBTs, diodes, measurement circuits for measuring characteristics of the IGBTs and the diodes, and a memory for storing initial values of predetermined characteristics of the IGBTs and the diodes, measured values of characteristics of the IGBTs and the diodes measured by measurement circuits, and a predetermined determination value for characteristic degradation of the IGBTs and the diodes.

1 Claim, 4 Drawing Sheets

(51) Int. Cl.
*B66B 5/00* (2006.01)
*G01R 31/26* (2020.01)

(56) References Cited

U.S. PATENT DOCUMENTS

| | | | | |
|---|---|---|---|---|
| 2014/0253170 | A1* | 9/2014 | Lipp | G01R 31/2642 324/762.01 |
| 2016/0252402 | A1* | 9/2016 | Singh | G01N 33/00 702/130 |
| 2017/0003337 | A1* | 1/2017 | Bito | H03K 19/018507 |
| 2017/0074921 | A1* | 3/2017 | Uota | H01L 29/1608 |
| 2017/0350934 | A1* | 12/2017 | Sathik | H02M 7/217 |
| 2018/0017612 | A1* | 1/2018 | Burton-Ccoca | G01K 7/01 |
| 2018/0231601 | A1* | 8/2018 | Heiss | G01R 31/2642 |
| 2019/0285689 | A1* | 9/2019 | Degrenne | G01K 1/14 |
| 2020/0065449 | A1* | 2/2020 | Theriault | G06F 11/3058 |

FOREIGN PATENT DOCUMENTS

| | | | |
|---|---|---|---|
| CN | 104764988 | A | 7/2015 |
| CN | 106324465 | A | 1/2017 |
| JP | 2003-134795 | A | 5/2003 |
| JP | 2011200033 | A | 10/2011 |
| JP | 2017-017822 | A | 1/2017 |

OTHER PUBLICATIONS

An Office Action mailed by China National Intellectual Property Administration on May 6, 2022, which corresponds to Chinese Patent Application No. 202010078774.1 and is related to U.S. Appl. No. 16/668,883; with English language translation.

An Office Action mailed by China National Intellectual Property Administration on Oct. 11, 2022, which corresponds to Chinese Patent Application No. 202010078774.1 and is related to U.S. Appl. No. 16/668,883; with English language translation.

An Office Action mailed by China National Intellectual Property Administration on Feb. 11, 2023, which corresponds to Chinese Patent Application No. 202010078774.1 and is related to U.S. Appl. No. 16/668,883; with English language translation.

An Office Action mailed by China National Intellectual Property Administration on Sep. 21, 2023, which corresponds to Chinese Patent Application No. 202010078774.1 and is related to U.S. Appl. No. 16/668,883; with English language translation.

An Office Action; mailed by the State Intellectual Property Office of the People's Republic of China on Jun. 25, 2023, which corresponds to Chinese Patent Application No. 202010078774.1 and is related to U.S. Appl. No. 16/668,883.

* cited by examiner

F I G. 1
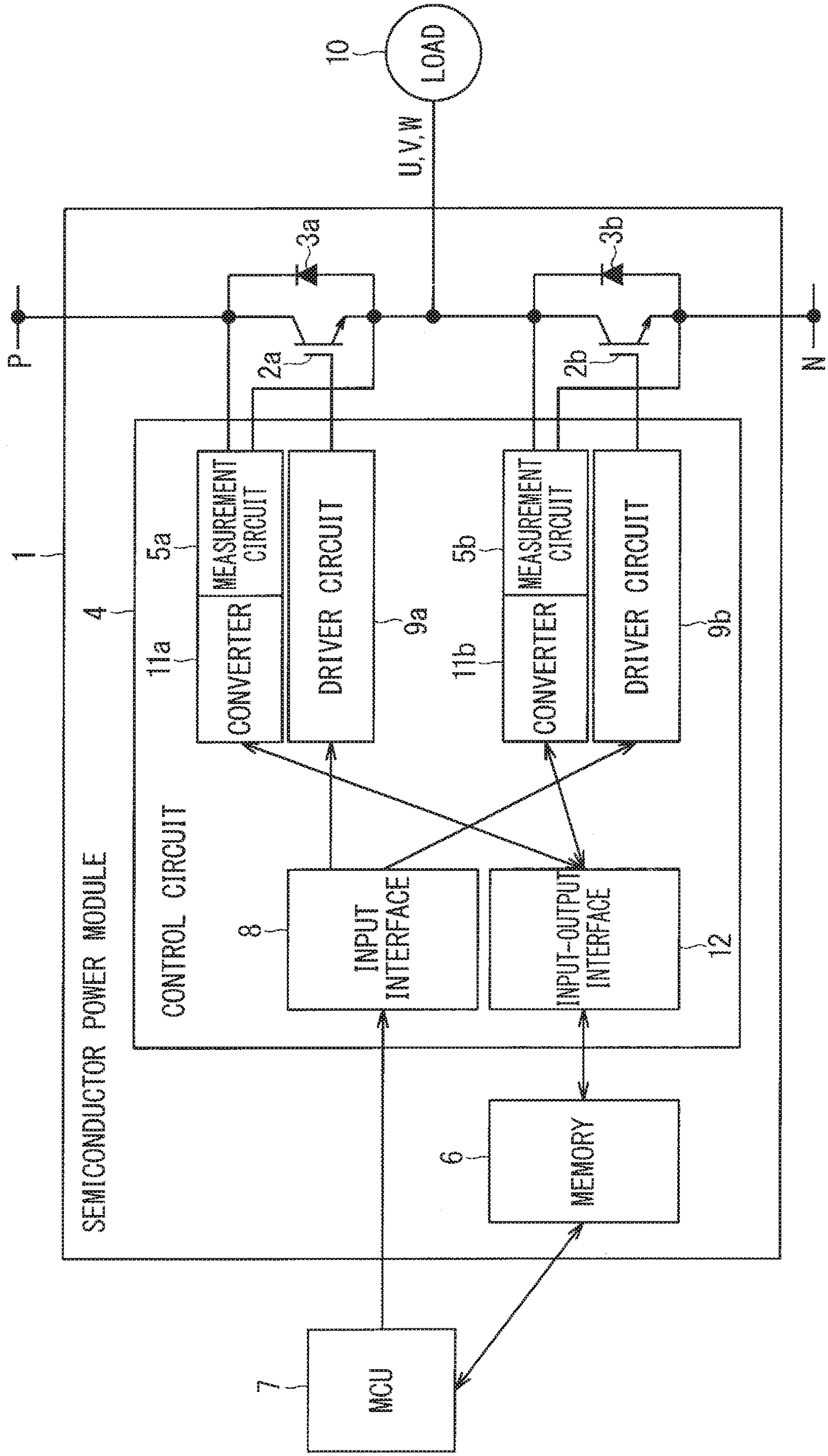

F I G. 2
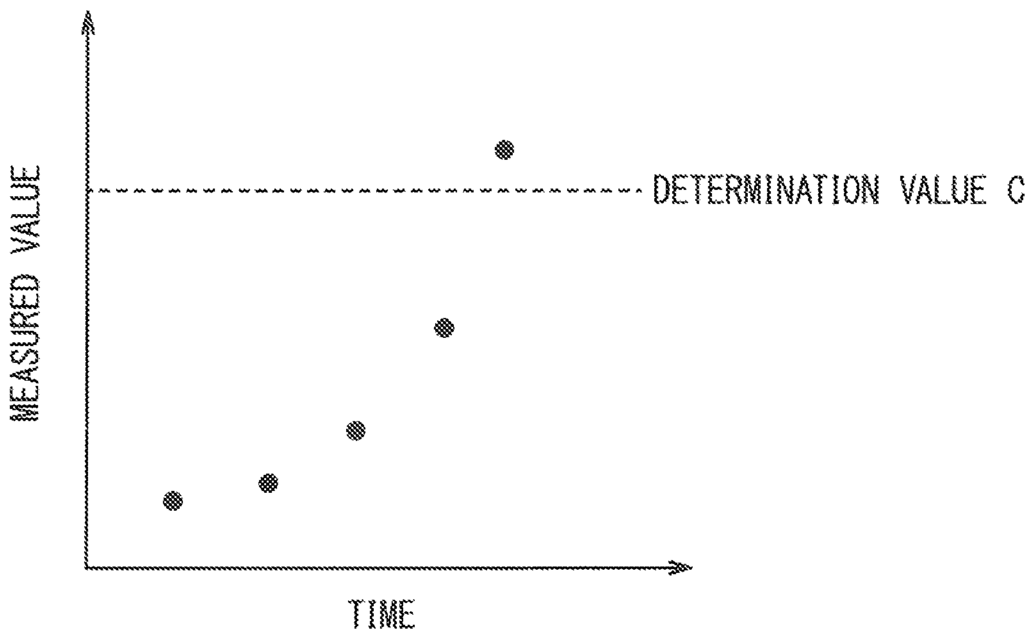
F I G. 3
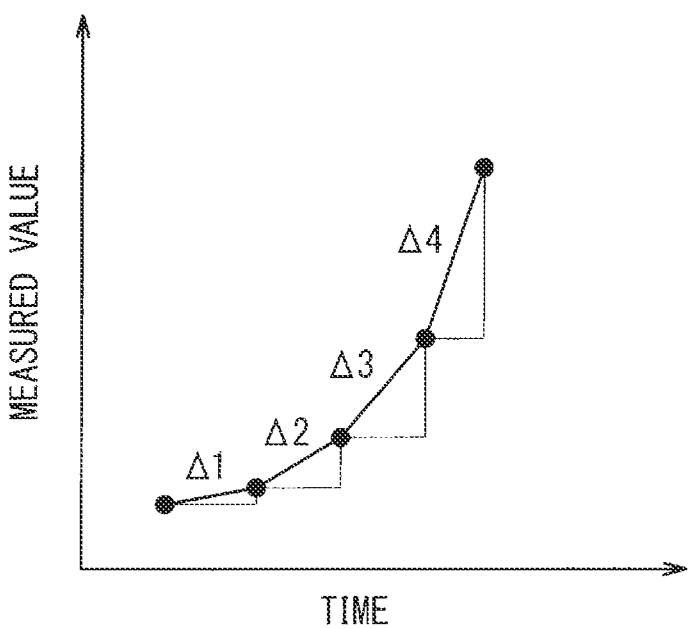

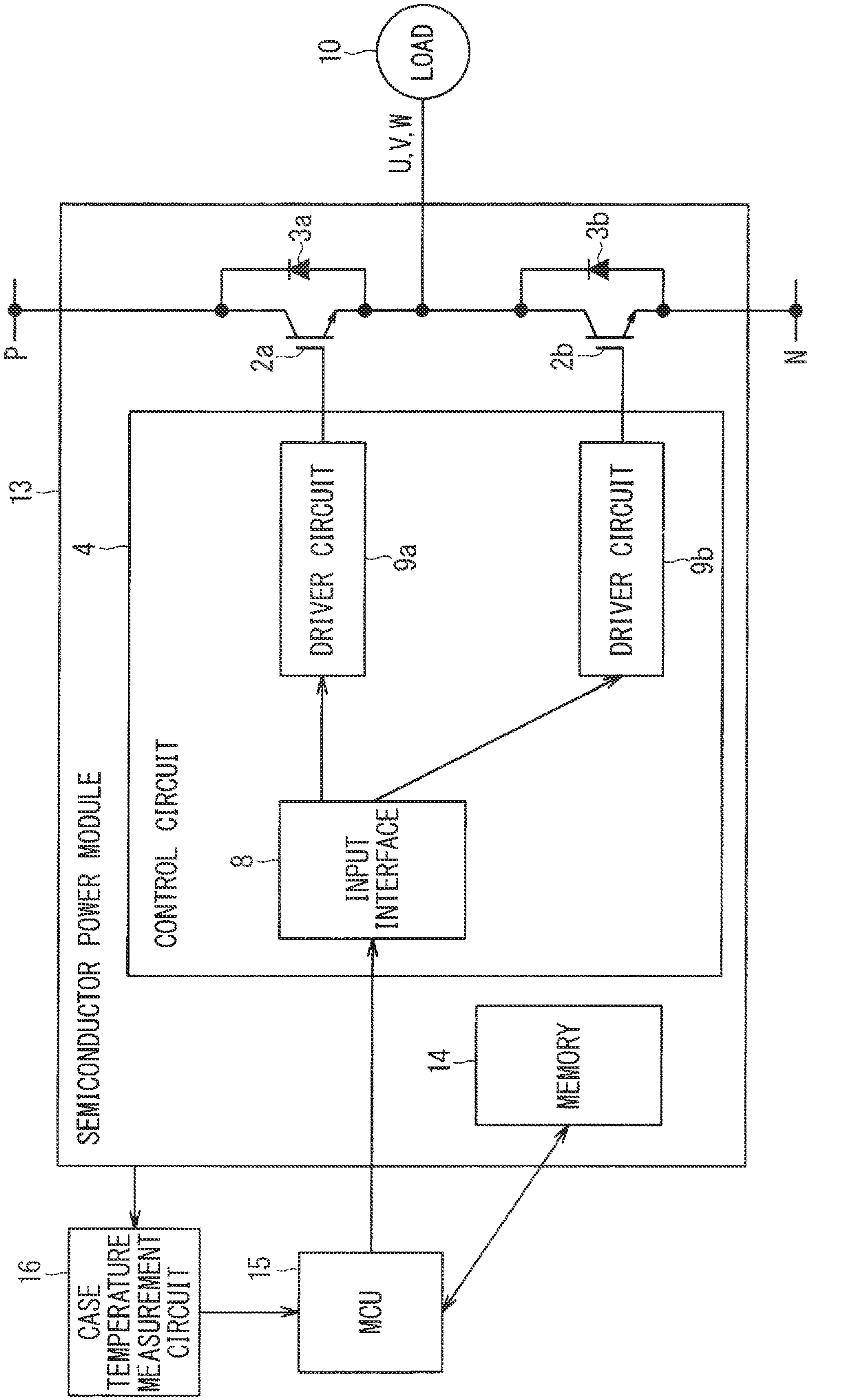
F I G 4

SEMICONDUCTOR MODULE AND LIFE PREDICTION SYSTEM FOR SEMICONDUCTOR MODULE

BACKGROUND OF THE INVENTION

Field of the Invention

The present invention relates to a semiconductor module and a life prediction system for the semiconductor module.

Description of the Background Art

Conventionally, a technique for determining and dealing with the life of a circuit element included in an elevator drive system which does not require a special sensor for determining the life thereof has been disclosed (see, for example, Japanese Patent Application Laid-Open No. 2011-200033). The circuit element includes an Insulated Gate Bipolar Transistor (IGBT) and a diode. Specifically, the life of the circuit element is determined by comparing a measured value of the voltage of the circuit element included in the inverter device with a predetermined initial value of the voltage of the circuit element in the elevator control device. When a difference between the initial value and the measured value exceeds a predetermined determination value, a warning lamp is lit to warn that the circuit element is approaching the end of its life.

SUMMARY

In Japanese Patent Application Laid-Open No. 2011-200033, the inverter device is connected to the elevator control device via a measurement circuit, and thus may be affected by disturbances. In this case, there is a problem that measurement accuracy is lowered. Thus, conventionally, it cannot be said that the life of a semiconductor module is precisely predicted.

The present invention has been made to solve such a problem, and an object thereof is to provide the semiconductor module which can predict a life precisely, and the life prediction system for the semiconductor module.

The semiconductor module according to the present invention includes at least one semiconductor element, a measurement circuit for measuring characteristics of the semiconductor element, an initial value of a predetermined characteristic of the semiconductor element, a measured value of the characteristic of the semiconductor element measured by the measurement circuit, and a memory for storing a predetermined determination value of characteristic degradation of the semiconductor element.

The semiconductor module includes at least one semiconductor element, the measurement circuit for measuring characteristics of the semiconductor element, the initial value of a predetermined characteristic of the semiconductor element, the measured value of the characteristic of the semiconductor element measured by the measurement circuit, and the memory for storing a predetermined determination value of characteristic degradation of the semiconductor element; therefore, the semiconductor module can precisely predict the life thereof.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram illustrating an example of a configuration of a life prediction system for a semiconductor power module according to Embodiment 1 of the present invention;

FIG. 2 is a graph illustrating the life prediction of the semiconductor power module according to Embodiment 1 of the present invention;

FIG. 3 is a graph illustrating the life prediction of a semiconductor power module according to Embodiment 2 of the present invention;

FIG. 4 is a block diagram illustrating an example of a configuration of a life prediction system for a semiconductor power module according to Embodiment 3 of the present invention.

DESCRIPTION OF THE PREFERRED EMBODIMENTS

Figure 5:
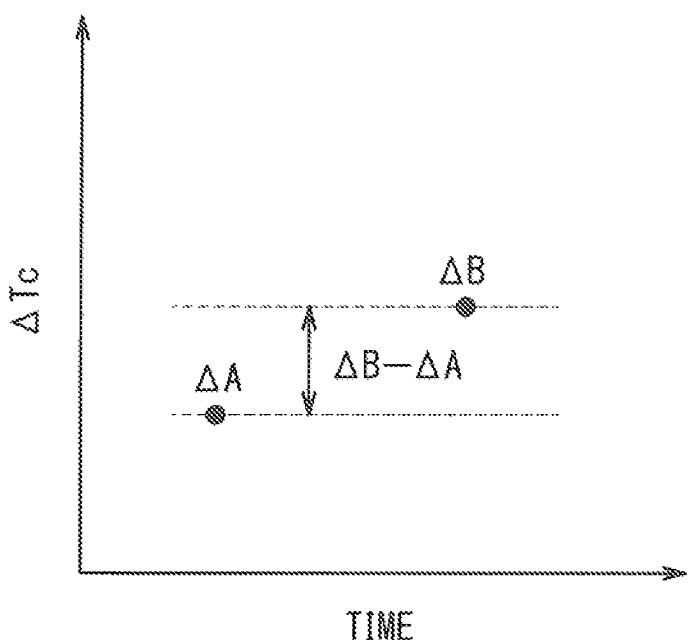
FIG. 5 is a graph illustrating the life prediction of a semiconductor power module according to Embodiment 3 of the present invention.

Embodiments of the present invention will be described below with reference to the drawings.

Embodiment 1

<Configuration>

FIG. 1 is a block diagram illustrating an example of a configuration of a life prediction system for the semiconductor power module according to Embodiment 1.

As illustrated in FIG. 1, the life prediction system for the semiconductor power module according to Embodiment 1 includes a semiconductor power module 1 and a Micro Controller Unit (MCU) 7. The semiconductor power module 1 controls the operation of a load 10. The load 10 includes, for example, a three-phase AC motor.

The semiconductor power module 1 includes IGBTs 2*a* and 2*b* and diodes 3*a* and 3*b*, which are semiconductor elements, a control circuit 4, and a memory 6. The control circuit 4 includes measurement circuits 5*a* and 5*b*, converters 11*a* and 11*b*, drive circuits 9*a* and 9*b*, an input interface 8, and an input-output interface 12.

The measurement circuits 5*a* and 5*b* measure the characteristics of the IGBTs 2*a* and 2*b* and the diodes 3*a* and 3*b*. Specifically, the measurement circuit 5*a* is connected to each of the IGBT 2*a* and the diode 3*a*, measures the collector voltage and the emitter voltage of the IGBT 2*a*, and measures the anode voltage and the cathode voltage of the diode 3*a*. The collector voltage and the emitter voltage of the IGBT 2*a* measured by the measurement circuit 5*a* are converted from analog to digital by the converter 11*a* and stored in the memory 6 via the input-output interface 12. The anode voltage and the cathode voltage of the diode 3*a* measured by the measurement circuit 5*a* are converted from analog to digital by the converter 11*a* and stored in the memory 6 via the input-output interface 12.

Meanwhile, the measurement circuit 5*b* is connected to each of the IGBT 2*b* and the diode 3*b*, measures the collector voltage and the emitter voltage of the IGBT 2*b*, and measures the anode voltage and the cathode voltage of the diode 3*b*. The collector voltage and the emitter voltage of the IGBT 2*b* measured by the measurement circuit 5*b* are converted from analog to digital by the converter 11*b* and stored in the memory 6 via the input-output interface 12. The anode voltage and the cathode voltage of the diode 3*b* measured by the measurement circuit 5*b* are converted from analog to digital by the converter 11*b* and stored in the memory 6 via the input-output interface 12.

The driver circuit 9*a* drives the IGBT 2*a* in accordance with a control signal input from the MCU 7 via the input interface 8. The driver circuit 9*b* drives the IGBT 2*b* in accordance with an instruction from the MCU 7 via the input interface 8.

The memory 6 includes, for example, an Erasable Programmable Read Only Memory (EPROM), and stores the collector voltages and the emitter voltages of the IGBTs 2*a* and 2*b* and the anode voltages and the cathode voltages of the diodes 3*a* and 3*b* measured by the measurement circuits 5*a* and 5*b*, respectively.

Further, the memory 6 stores determination value for determining the characteristic degradation of the IGBTs 2*a* and 2*b* and the diodes 3*a* and 3*b*. The determination value taking the operating environment of the semiconductor power module 1 into account can be set in the memory 6 by the MCU 7. Note that the timing at which the MCU 7 sets the determination value in the memory 6 may be any timing as long as it comes before MCU 7 determines characteristic degradation of the IGBTs 2*a* and 2*b* and diodes 3*a* and 3*b*.

Further, the memory 6 stores initial values of the respective characteristics of the IGBTs 2*a* and 2*b* and the diodes 3*a* and 3*b*. The initial values taking the operating environment of the semiconductor power module 1 into account can be set in the memory 6 by the MCU 7. Note that the timing at which the MCU 7 sets the initial values in the memory 6 may be any timing as long as it comes before the measured value of each of the IGBTs 2*a* and 2*b* and diodes 3*a* and 3*b* is stored in the memory 6.

The MCU 7 inputs a control signal to each of the drive circuits 9, 9*b* via the input interface 8. Further, the MCU 7 can directly access the memory 6, read out information from the memory 6, and write information into the memory 6. Further, the MCU 7 predicts the life of the semiconductor power module 1 based on the information stored in the memory 6. That is, the MCU 7 has a function as a prediction unit that predicts the life of the semiconductor power module 1.

<Operation>

The MCU 7 inputs a command to the memory 6 when the characteristics of the IGBTs 2*a* and 2*b* and the diodes 3*a* and 3*b* are measured. The command input from the MCU 7 to the memory 6 is input to the converters 11*a* and 11*b* via the input-output interface 12, and is converted from digital to analog and then input to the measurement circuits 5*a* and 5*b*. That is, the measurement circuits 5*a* and 5*b* measure the characteristics of the IGBTs 2*a* and 2*b* and the diodes 3*a* and 3*b* in accordance with the command from the MCU 7.

Further, when measuring the characteristics of the IGBTs 2*a* and 2*b* and the diodes 3*a* and 3*b*, the MCU 7 inputs a control signal that serves as a current under a certain condition to each of the drive circuits 9*a* and 9*b*. The driver circuit 9*a* drives the IGBT 2*a* in accordance with the control signal input from the MCU 7. The driver circuit 9*b* drives the IGBT 2*b* in accordance with the control signal input from the MCU 7.

The measurement circuit 5*a* measures the collector voltage and the emitter voltage of the IGBT 2*a* and measures the anode voltage and the cathode voltage of the diode 3*a*. The collector voltage and the emitter voltage of the IGBT 2*a* and the anode voltage and the cathode voltage of the diode 3*a* are stored in the memory 6 as measured values of the respective characteristics of the IGBT 2*a* and the diode 3*a*.

Meanwhile, the measurement circuit 5*b* measures the collector voltage and the emitter voltage of the IGBT 2*b*, and measures the anode voltage and the cathode voltage of the diode 3*b*. The collector voltage and the emitter voltage of the IGBT 2*b* and the anode voltage and the cathode voltage of the diode 3*b* are stored in the memory 6 as measured values of the respective characteristics of the IGBT 2*b* and the diode 3*b*.

Accordingly, the memory 6 stores measured values of the respective characteristics of the IGBTs 2*a* and 2*b* and the diodes 3*a* and 3*b*. The measured values are stored in the memory 6 every time measurement is performed. In other words, the measured values for a plurality of times can be stored in the memory 6.

The MCU 7 reads out the measured values of each of the IGBTs 2*a* and 2*b* and the diodes 3*a* and 3*b*, the initial values of the characteristics of each of the IGBTs 2*a* and 2*b* and the diodes 3*a* and 3*b*, and the determination value stored in the memory 6 and determines the characteristic degradation of each of IGBTs 2*a* and 2*b* and diodes 3*a* and 3*b*.

Specifically, as illustrated in FIG. 2, the MCU 7 compares the measured values of the semiconductor elements with a predetermined determination value C. Then, the MCU 7 determines that the characteristics of the semiconductor elements have degraded when the measured value becomes equal to or more than the determination value C. In this case, the MCU 7 predicts that the life of the semiconductor power module 1 has been shortened, that is, the end of the life of the semiconductor power module 1 is approaching.

<Effect>

As described above, according to Embodiment 1, the semiconductor power module 1 includes the measurement circuits 5*a* and 5*b* and the memory 6 and is less likely to be subject to disturbance; therefore, the precise life prediction of the semiconductor power module 1 is ensured.

Accordingly, the memory 6 can store the measured values of the semiconductor elements for a plurality of times. Therefore, the MCU 7 can determine the characteristic degradation of the semiconductor elements based on transition of the initial values and the plurality of measured values.

In the case where the memory 6 is provided outside the semiconductor power module 1, data stored in the memory 6 need to be deleted after parts replacement or the like. On the other hand, according to Embodiment 1, the memory 6 is built in the semiconductor power module 1; therefore, deletion of data stored in the memory 6 is not required after parts replacement or the like. Therefore, the algorithm of MCU 7 can be simplified.

When determining the life of a semiconductor power module, of which use is not limited to an elevator drive system such as Japanese Patent Application Laid-Open No. 2011-200033, initial values and a determination value taking the operating environment of the semiconductor power module 1 into account are required to be set. According to Embodiment 1, the MCU 7 can directly access the memory 6 and write the initial values and the determination value taking the operating environment of the semiconductor power module into account at an arbitrary timing. Therefore, the life prediction accuracy of the semiconductor power module 1 can be improved.

Embodiment 2

<Configuration>

The configuration of a life prediction system for a semiconductor power module according to Embodiment 2 is the same as the configuration of the life prediction system for the semiconductor power module illustrated in FIG. 1 and the detailed description thereof is omitted here. Also, the operation of the semiconductor power module 1 is the same as that of Embodiment 1, the detailed description thereof is omitted here.

<Operation>

In Embodiment 2, the prediction method of the life of the semiconductor power module 1 by the MCU 7 is different from that of Embodiment 1. Hereinafter, prediction of the life of the semiconductor power module 1 according to Embodiment 2 will be described.

The MCU 7 reads out the measured values of the IGBTs 2*a* and 2*b* and the diodes 3*a* and 3*b* and the initial values of the characteristics of the IGBTs 2*a* and 2*b* and the diodes 3*a* and 3*b* stored in the memory 6 and determines the characteristic degradation of each of IGBTs 2*a* and 2*b* and diodes 3*a* and 3*b*.

Specifically, as illustrated in FIG. 3, the MCU 7 calculates the variation rate of the measured values based on each measured value. In the example of FIG. 3, the variation rate of the measured value is indicated by Δ1 to Δ4. It should be noted that, the MCU 7 may calculate the variation rate of the measured values at an arbitrary timing, and may store the variation rate of the measured values calculated by the MCU 7 in the memory 6. In such a case, the MCU 7 reads out the measured values of each of the IGBTs 2*a* and 2*b* and the diodes 3*a* and 3*b*, the initial values of the characteristics of each of the IGBTs 2*a* and 2*b* and the diodes 3*a* and 3*b*, and the variation rate of the measured value of each of IGBTs 2*a* and 2*b* and diodes 3*a* and 3*b* calculated in the past from the memory 6.

Then, the MCU 7 compares the calculated variation rate of the measured values with a predetermined determination value D. The determination value D is a value for determining the respective characteristic degradation of the IGBTs 2*a* and 2*b* and the diodes 3*a* and 3*b*, and can be set in the memory 6 by the MCU 7. Note that the timing at which the MCU 7 sets the determination value D in the memory 6 may be any timing as long as it comes before MCU 7 determines characteristic degradation of IGBTs 2*a* and 2*b* and diodes 3*a* and 3*b*.

Then, the MCU 7 determines that the characteristics of the semiconductor elements have degraded when the variation rate of the measured values becomes equal to or more than the determination value D. In this case, the MCU 7 predicts that the life of the semiconductor power module 1 has been shortened, that is, the end of the life of the semiconductor power module 1 is approaching.

<Effect>

As described above, according to Embodiment 2, as is the same with Embodiment 1, the precise life prediction of the semiconductor power module 1 is ensured.

Embodiment 3

<Configuration>

FIG. 4 is a block diagram illustrating an example of a configuration of a life prediction system for a semiconductor power module according to Embodiment 3.

As illustrated in FIG. 4, the life prediction system for the semiconductor power module according to Embodiment 3 includes a semiconductor power module 13, MCU 15, and a case temperature measurement circuit 16. The semiconductor power module 13 controls the operation of a load 10.

The semiconductor power module 13 includes IGBTs 2*a* and 2*b* and diodes 3*a* and 3*b*, which are semiconductor elements, a control circuit 4, and a memory 14. The control circuit 4 includes an input interface 8 and drive circuits 9*a* and 9*b*. The input interface 8 and the drive circuits 9*a* and 9*b* are the same as the input interface 8 and the drive circuits 9*a* and 9*b* illustrated in FIG. 1 described in Embodiment 1, and thus the description thereof is omitted here.

The memory 14 includes, for example, EPROM, and stores the case temperature of the semiconductor power module 13 measured by the case temperature measurement circuit 16. Further, the memory 14 stores determination values for determining the characteristic degradation of the semiconductor elements. The determination values taking the operating environment of the semiconductor power module 13 into account can be set in the memory 14 by the MCU 15. Note that the timing at which the MCU 15 sets the determination value in the memory 14 may be any timing as long as it comes before the MCU 15 predicts the life of the semiconductor power module 13.

The case temperature measurement circuit 16 is connected to the semiconductor power module 13 and measures the case temperature of the semiconductor power module 13.

The MCU 15 inputs a control signal to each of the drive circuits 9*a* and 9*b* via the input interface 8. Further, the MCU 15 can directly access the memory 14 to read out information from the memory 14 and write information to the memory 14. Further, the MCU 7 predicts the life of the semiconductor power module 13 based on the information stored in the memory 14. That is, the MCU 15 has a function as a prediction unit that predicts the life of the semiconductor power module 13.

<Operation>

First, the case temperature measurement circuit 16 measures the case temperature Tc, which is the first case temperature, when the semiconductor power module 13 is not in operation at the first timing. The MCU 15 stores the case temperature Tc measured by the case temperature measurement circuit 16 at this time in the memory 14 as the initial value A1.

Immediately thereafter, the MCU 15 inputs a control signal that serves as a current under a certain condition to each of the drive circuits 9*a* and 9*b*. The driver circuit 9*a* drives the IGBT 2*a* in accordance with the control signal input from the MCU 15. The driver circuit 9*b* drives the IGBT 2*b* in accordance with the control signal input from the MCU 15. The case temperature measurement circuit 16 measures the case temperature Tc, which is the second case temperature, when the semiconductor power module 13 is in operation. The MCU 15 stores the case temperature Tc measured by the case temperature measurement circuit 16 at this time in the memory 14 as the measured value A2.

Next, the case temperature measurement circuit 16 measures the case temperature Tc, which is the third case temperature, when the semiconductor power module 13 is not in operation at the second timing after a certain period from the above measurement. The MCU 15 stores the case temperature Tc measured by the case temperature measurement circuit 16 at this time in the memory 14 as the initial value B1.

Immediately thereafter, the MCU 15 drives the drive circuits 9*a* and 9*b* in the same manner as described above. The case temperature measurement circuit 16 measures the case temperature Tc when the semiconductor power module 13 is in operation. The MCU 15 stores the case temperature Tc, which is the fourth case temperature, measured by the case temperature measurement circuit 16 at this time in the memory 14 as the measured value B2.

Accordingly, the memory 14 stores the initial value A1, the measured value A2, the initial value B1, and the measured value B2 as the case temperature of the semiconductor power module 13.

The MCU 15 reads out the initial value A1, the measured value A2, the initial value B1, the measured value B2, and the determination value stored in the memory 14, and determines the characteristic degradation of the semiconductor elements.

Specifically, as illustrated in FIG. 5, the MCU 15 sets the difference between the initial value A1 and the measured value A2 as ΔA, and sets the difference between the initial value B1 and the measured value B2 as ΔB. Then, the MCU 15 determines that the characteristics of the semiconductor elements have degraded when the difference between ΔA and ΔB becomes equal to or more than the determination value E. In this case, the MCU 15 predicts that the life of the semiconductor power module 13 has been shortened, that is, the end of the life of the semiconductor power module 13 is approaching.

It should be noted that, the MCU 15 may calculate the difference between the initial value and the measured value at an arbitrary timing, and may store the difference between the initial value and the measured value calculated by the MCU 15 in the memory 14. In this case, the MCU 15 reads out from the memory 14 the initial value and the measured value, and the difference between the initial value and the measured value calculated in the past.

In the above, although the case where the life of the semiconductor power module 13 is predicted based on the case temperature difference of the semiconductor power module 13 has been described, the life of the semiconductor power module 13 may be predicted based on a difference in characteristics other than the case temperature or transition in the difference in the characteristics.

<Effect>

As described above, according to Embodiment 3, as is the same with Embodiment 1, the precise life prediction of the semiconductor power module 1 is ensured.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A life prediction system for the semiconductor module, comprising:

a semiconductor module including:

at least one semiconductor element;

a memory configured to store respective case temperatures when the semiconductor element is in operation and when the semiconductor element is not in operation, and a determination value of predetermined characteristic degradation of the semiconductor element; and a prediction unit configured to predict a life of the semiconductor module, wherein the prediction unit is configured to predict the life of the semiconductor module based on each of the case temperatures and the determination value stored in the memory, the memory is configured to store a first case temperature at a first timing when the semiconductor element is not in operation, a second case temperature at the first timing when the semiconductor element is in operation, a third case temperature at a second timing, which is different from the first timing, when the semiconductor element is not in operation, and a fourth case temperature at the second timing when the semiconductor element is in operation, and the prediction unit is configured to determine that the characteristic of the semiconductor element has been degraded when a difference between a difference between the first case temperature and the second case temperature and a difference between the third case temperature and the fourth case temperature has become equal to or more than the determination value, and predict that the life of the semiconductor module has been shortened.

* * * * *